United States Patent
Bard et al.

(10) Patent No.: US 6,964,897 B2
(45) Date of Patent: Nov. 15, 2005

(54) SOI TRENCH CAPACITOR CELL INCORPORATING A LOW-LEAKAGE FLOATING BODY ARRAY TRANSISTOR

(75) Inventors: Karen A. Bard, Hopewell Junction, NY (US); David M. Dobuzinsky, New Windsor, NY (US); Herbert L. Ho, New Windsor, NY (US); Mahendar Kumar, Fishkill, NY (US); Denise Pendleton, Wappingers Falls, NY (US); Michael D. Steigerwalt, Newburgh, NY (US); Brian L. Walsh, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 10/250,157

(22) Filed: Jun. 9, 2003

(65) Prior Publication Data

US 2004/0248363 A1 Dec. 9, 2004

(51) Int. Cl.[7] .......................................... H01L 21/8242
(52) U.S. Cl. ........................................................ 438/243
(58) Field of Search ................................. 438/761, 597, 438/592, 253, 246, 243, 200, 149, 3, 387, 151; 257/304, 303, 302, 301, 300

(56) References Cited

U.S. PATENT DOCUMENTS

| | | |
|---|---|---|
| 5,587,604 A | 12/1996 | Machesney |
| 5,670,388 A | 9/1997 | Machesney |
| 5,767,549 A | 6/1998 | Chen |
| 5,770,881 A | 6/1998 | Pelella |
| 5,774,411 A | 6/1998 | Hsieh |
| 5,889,306 A | 3/1999 | Christensen |
| 5,894,152 A | 4/1999 | Jaso |
| 5,923,067 A | 7/1999 | Voldman |
| 5,930,643 A | 7/1999 | Sadana |
| 5,998,847 A | 12/1999 | Assaderaghi |
| 6,005,415 A | 12/1999 | Solomon |
| 6,020,239 A | 2/2000 | Gambino |
| 6,020,581 A | 2/2000 | Dennard |
| 6,023,577 A | 2/2000 | Smith |
| 6,048,756 A | 4/2000 | Lee |
| 6,074,899 A | 6/2000 | Voldman |
| 6,107,125 A | 8/2000 | Jaso |
| 6,111,778 A | 8/2000 | MacDonald |
| 6,121,659 A | 9/2000 | Christensen |
| 6,133,799 A | 10/2000 | Favors |
| 6,136,655 A | 10/2000 | Assaderagh |
| 6,144,054 A | 11/2000 | Agahi |
| 6,160,292 A | 12/2000 | Flaker |
| 6,177,299 B1 | 1/2001 | Hsu |
| 6,204,532 B1 | 3/2001 | Gambino |
| 6,239,591 B1 | 5/2001 | Bryant |
| 6,239,649 B1 | 5/2001 | Bertini |
| 6,242,763 B1 | 6/2001 | Chen |
| 6,245,600 B1 | 6/2001 | Geissler |
| 6,259,137 B1 | 7/2001 | Sadana |
| 6,281,737 B1 | 8/2001 | Kuang |
| 6,284,593 B1 | 9/2001 | Mandelman |
| 6,288,572 B1 | 9/2001 | Nowka |
| 6,303,441 B1 | 10/2001 | Park |
| 6,333,532 B1 | 12/2001 | Davari |

(Continued)

*Primary Examiner*—Craig A. Thompson
*Assistant Examiner*—Monica D. Harrison
(74) *Attorney, Agent, or Firm*—Eric W. Petraske

(57) ABSTRACT

A DRAM array in an SOI wafer having a uniform BOX layer extending throughout the array eliminates the collar oxide step in processing; connects the buried plates with an implant that, in turn, is connected to a conductive plug extending through the device layer and the box that is biased at ground; while the pass transistors are planar NFETs having floating bodies that have a leakage discharge path to ground through a grounded bitline.

25 Claims, 5 Drawing Sheets

U.S. PATENT DOCUMENTS

| | | | |
|---|---|---|---|
| 6,335,239 B1 | 1/2002 | Agahi |
| 6,344,671 B1 | 2/2002 | Mandelman |
| 6,350,653 B1 | 2/2002 | Adkisson |
| 6,404,269 B1 | 6/2002 | Voldman |
| 6,410,962 B2 | 6/2002 | Geissler |
| 6,429,056 B1 | 8/2002 | Bryant |
| 6,429,477 B1 | 8/2002 | Mandelman |
| 6,433,589 B1 | 8/2002 | Ju |
| 6,436,744 B1 | 8/2002 | Bryant |
| 6,437,388 B1 | 8/2002 | Radens |
| 6,440,872 B1 | 8/2002 | Mandelman |
| 6,441,422 B1 | 8/2002 | Mandelman |
| 6,452,448 B1 | 9/2002 | Bonaccio |
| 6,459,106 B2 | 10/2002 | Bryant |
| 6,490,546 B1 | 12/2002 | Kimmel |
| 6,492,244 B1 | 12/2002 | Christensen |
| 6,498,057 B1 | 12/2002 | Christensen |
| 6,534,824 B1 | 3/2003 | Mandelman |
| 6,553,561 B2 | 4/2003 | Bard |
| 6,555,891 B1 | 4/2003 | Furukawa |
| 6,567,773 B1 | 5/2003 | Rahmat |
| 6,570,208 B2 | 5/2003 | Mandelman |
| 6,573,545 B2 | 6/2003 | Kim |
| 6,573,576 B2 | 6/2003 | Park |
| 6,576,945 B2 | 6/2003 | Mandelman |
| 6,590,259 B2 | 7/2003 | Adkisson |
| 6,613,615 B2 | 9/2003 | Mandelman |
| 6,635,525 B1 * | 10/2003 | Mandelman et al. ....... 438/243 |
| 6,635,543 B2 | 10/2003 | Furukawa |
| 6,657,252 B2 | 12/2003 | Fried |
| 6,661,682 B2 | 12/2003 | Kim |
| 6,667,518 B2 | 12/2003 | Christensen |
| 6,670,675 B2 | 12/2003 | Ho |
| 6,670,716 B2 | 12/2003 | Christensen |
| 6,707,095 B1 | 3/2004 | Chidambarrao |
| 6,734,056 B2 | 5/2004 | Mandelman |
| 6,744,083 B2 | 6/2004 | Chen |
| 6,750,097 B2 | 6/2004 | Divakaruni |
| 6,756,257 B2 | 6/2004 | Davari |
| 6,759,282 B2 | 7/2004 | Campbell |
| 6,774,395 B1 | 8/2004 | Lin |
| 6,789,099 B2 | 9/2004 | Kim |
| 6,806,140 B1 | 10/2004 | Kim |
| 6,808,981 B2 | 10/2004 | Mandelman |
| 6,885,055 B2 | 4/2005 | Lee |
| 2001/0001483 A1 | 5/2001 | Bryant |
| 2002/0037602 A1 | 3/2002 | Park |
| 2002/0105019 A1 | 8/2002 | Mandelman |
| 2002/0185684 A1 | 12/2002 | Campbell |
| 2003/0025157 A1 | 2/2003 | Ho |
| 2003/0028855 A1 | 2/2003 | Bard |
| 2003/0094654 A1 | 5/2003 | Christensen |
| 2003/0104681 A1 | 6/2003 | Davari |
| 2003/0116792 A1 | 6/2003 | Chen |
| 2003/0170936 A1 | 9/2003 | Christensen |
| 2003/0178670 A1 | 9/2003 | Fried |
| 2003/0237029 A1 | 12/2003 | Anderson |
| 2004/0023473 A1 | 2/2004 | Davakarlily |
| 2004/0248363 A1 | 12/2004 | Bard |
| 2004/0250221 A1 | 12/2004 | Bard |
| 2005/0072975 A1 | 4/2005 | Chen |
| 2005/0073874 A1 | 4/2005 | Chan |
| 2005/0079724 A1 | 4/2005 | Ho |

* cited by examiner

SOI TRENCH CAPACITOR CELL INCORPORATING A LOW-LEAKAGE FLOATING BODY ARRAY TRANSISTOR

BACKGROUND OF INVENTION

The field of the invention is that of SOI integrated circuits having DRAM arrays of trench capacitor cells.

Dynamic Random Access Memory (DRAM) cells are well known. A DRAM cell is essentially a capacitor for storing charge and a pass transistor (also called a pass gate or access transistor) for transferring charge to and from the capacitor. Data (1 bit) stored in the cell is determined by the absence or presence of charge on the storage capacitor. Because cell size determines chip density, size and cost, reducing cell area is one of the DRAM designer's primary goals. Reducing cell area is done, normally, by reducing feature size to shrink the cell.

Besides shrinking the cell features, the most effective way to reduce cell area is to reduce the largest feature in the cell, typically, the area of the storage capacitor. Unfortunately, shrinking the capacitor plate area reduces capacitance and, consequently, reduces stored charge. Reduced charge means that what charge is stored in the DRAM is more susceptible to noise, soft errors, leakage and other well known DRAM problems. Consequently, another primary goal for DRAM cell designers is to maintain storage capacitance while reducing cell area.

One way to accomplish this density goal without sacrificing storage capacitance is to use trench capacitors in the cells. Typically, trench capacitors are formed by etching long deep trenches in a silicon wafer and, then, placing each capacitor on its side in the trench, orienting the capacitors vertically with respect to the chip's surface. Thus, the surface area required for the storage capacitor is dramatically reduced without sacrificing capacitance, and correspondingly, storable charge.

However, since using a trench capacitor eliminates much of the cell surface area, i.e., that portion of cell area which was formerly required for the storage capacitor, the cell's access transistor has become the dominant cell feature determining array area. As a result, to further reduce cell and array area, efforts have been made to reduce access transistor area, which include making a vertical access transistor in the capacitor trench. See, for example, U.S. Pat. No. 6,426,252 entitled "Silicon-On-Insulator Vertical Array DRAM Cell With Self-Aligned Buried Strap" and references cited in it.

Performance is equally as important as density to DRAM design. Silicon(SOI) has been used to decrease parasitic capacitance and hence to improve integrated circuit chip performance. SOI reduces parasitic capacitance within the integrated circuit to reduce individual circuit loads, thereby improving circuit and chip performance. However, reducing parasitic capacitance is at odds with increasing or maintaining cell storage capacitance. Accordingly, SOI is seldom used for DRAM manufacture. One attempt at using SOI for DRAMS is taught in the cited patent.

In the case of transistors formed on SOI those skilled in the art conventionally introduce a contact to the body to drain away holes generated in the course of operation. Such body contacts add to the area of the cell and thus defeat some of the advantages of using SOI.

Thus, there is a need for increasing the number of stored data bits per chip of Dynamic Random Access Memory (DRAM) products. There is also a need for improving DRAM electrical performance without impairing cell charge storage.

SUMMARY OF INVENTION

The invention relates to an SOI integrated circuit having a DRAM array that employs planar transistors.

A feature of the invention is a reduction in processing time by the elimination of several processing steps in the trench capacitor including the collar oxide process.

Another feature of the invention is a floating body pass gate transistor.

Another feature of the invention is the elimination of a triple well isolation structure.

Another feature of the invention is the connection of the buried plates in the capacitors to a reference supply by means of at least one implant below the buried oxide (BOX).

DETAILED DESCRIPTION

Figure 1:
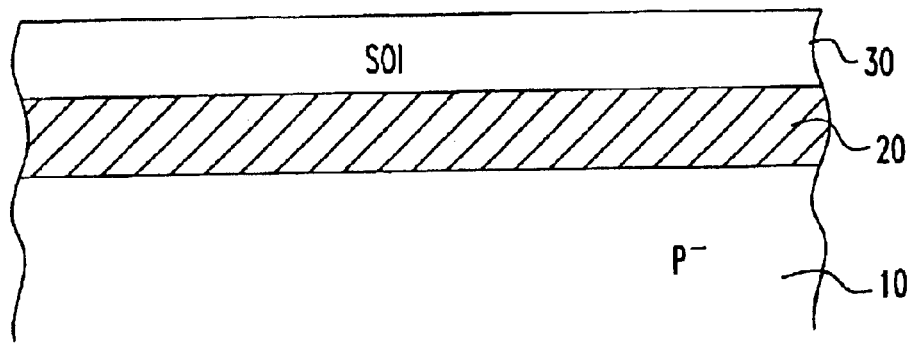
FIG. 1 shows a cross section of a portion of an SOI integrated circuit at the start of the process.

FIG. 1 shows a portion of an SOI integrated circuit wafer that will have a DRAM array and also support circuitry for the DRAM array and, in the case of an embedded DRAM chip, a logic area for the logic transistors performing the function of the chip.

The illustrated area shows P– substrate 10, having BOX 20 (130 nm) separating the substrate from the device layer 30 (70 nm), illustratively doped P– in the DRAM array and having P-type and N-type regions in the support areas and logic area.

Figure 2:
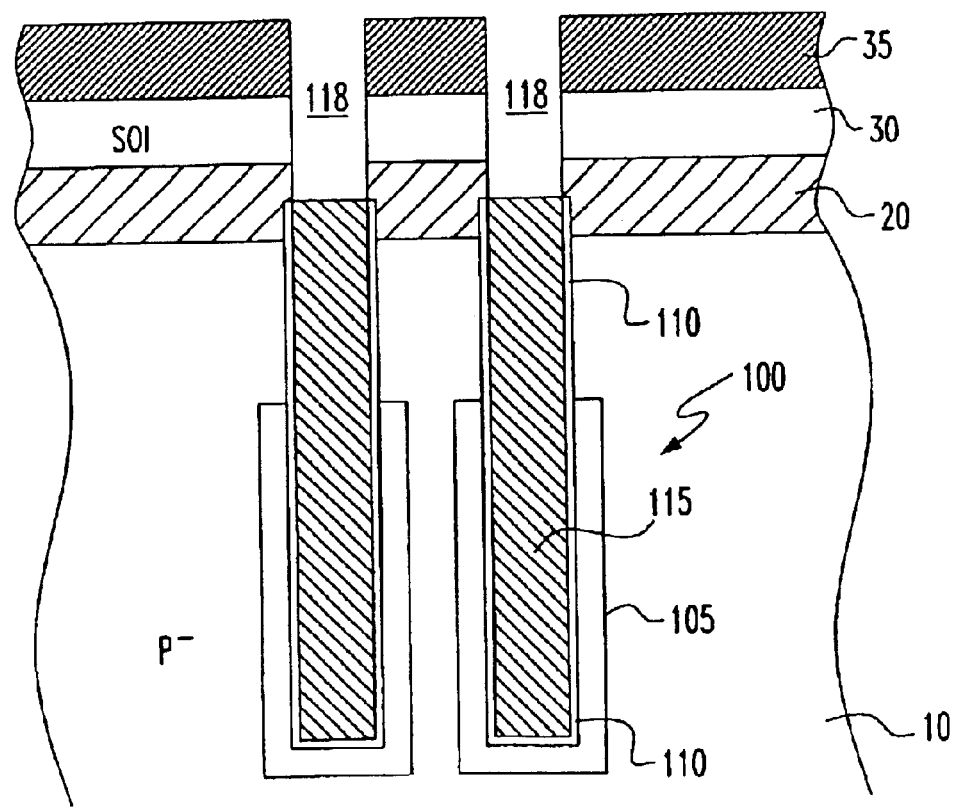
FIG. 2 shows a portion of the DRAM array after preliminary steps of forming the buried plate, dielectric and center electrode and recessing the center electrode.

FIG. 2 shows a portion of the DRAM array after a number of preliminary steps. A deep trench has been etched in the substrate through the pad layer 35, illustratively a layer of thermal oxide topped by nitride, then through silicon device layer 30, then through buried oxide (SiO2, BOX) 20, and then down about 8 um.

Buried plates 105 (N+) have been diffused into the substrate in a conventional process in which highly doped polycrystalline silicon (poly) is deposited and heated to diffuse dopant into the substrate. The buried plates are shown as extending only partially up to the bottom of the BOX, so that the buried plates are separated vertically from the box by a buried plate offset. In a later step, an implant will fill in the area below the BOX in the array and extend downwardly to overlap the buried plates in a vertical overlap region.

Optionally, one could extend the buried plates upward closer to or reaching the bottom of the BOX, which would increase the capacitance in the capacitor. In that case, the overlap region would be co-extensive with the implant.

At the top of FIG. 2, an aperture 118 has been formed by recessing the polysilicon center electrode of the capacitor down nominally to the mid-point of BOX 20. With the sidewalls of the trench exposed, the nitride capacitor dielectric is stripped and any desired treatment is applied to the trench sidewalls, e.g. a thin layer of thermal oxide or nitride to passivate the walls in the device layer while still permitting current to pass in and out of the capacitor.

In conventional trench DRAM processing, a "triple well" isolation scheme is required. Typically, the "triple well" consists of a —(1) "deep" p-well implant (peak concentration ~0.7 μm beneath the Si surface), (2) "medium" p-well implant (peak concentration ~0.3 — 0.4 μm below the Si surface), (3) "shallow" p-well implant (peak concentration ~30 —40 nm below the Si surface). The "deep" implant is needed to suppress the vertical parasitic device along the upper regions of the trench sidewall (plate to buried strap leakage, gated by the collar oxide & N+ polyfill). The "medium" p-well implant is used to isolate cross-talk of eDRAM cells in the lateral dimension. The "shallow" implant is used to adjust the threshold voltage of the array pass transistor. Here, eDRAM cells are contained in a p-well 117 that is isolated by an n-well that surrounds the eDRAM array blocks not shown in the Figure. One of the many advantages of the floating-body eDRAM cell is that the isolated p-well is no longer required — only a transistor threshold implant is necessary — thereby eliminating implant steps and lowering the processing cost of SOI eDRAM.

Further, SOI integrated circuits that have embedded DRAMS conventionally are required to form the SOI layers only in the logic portions of the chip, with the DRAM array being formed in an area that does not have the BOX. This patterning of the BOX, which is quite expensive, is not required for the practice of the current invention, thus saving considerable expense.

Figure 3:
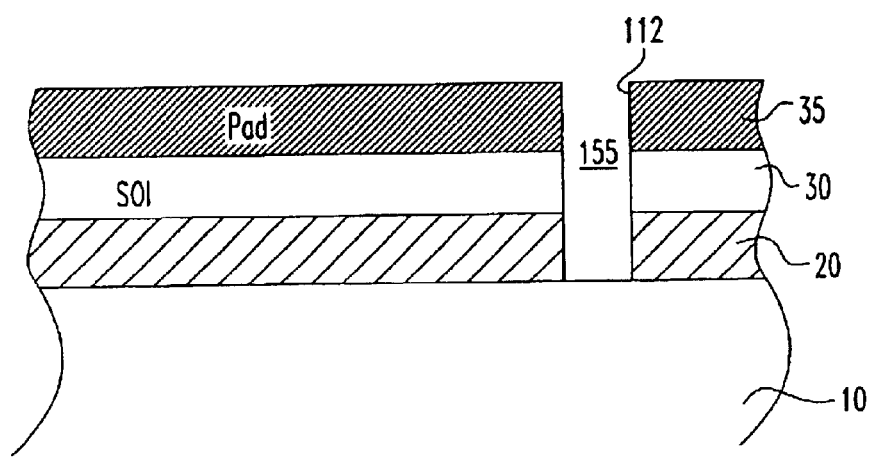
FIG. 3 shows a cross section of a via for establishing contact to the buried plates.

FIG. 3 shows a portion of the chip where a contact via that will connect the buried plates to a reference (ground) has been etched. This etch passes through pad nitride 35, SOI layer 30 and BOX 20, with the chemistry being changed to handle the different materials in a conventional manner.

Figure 4A:
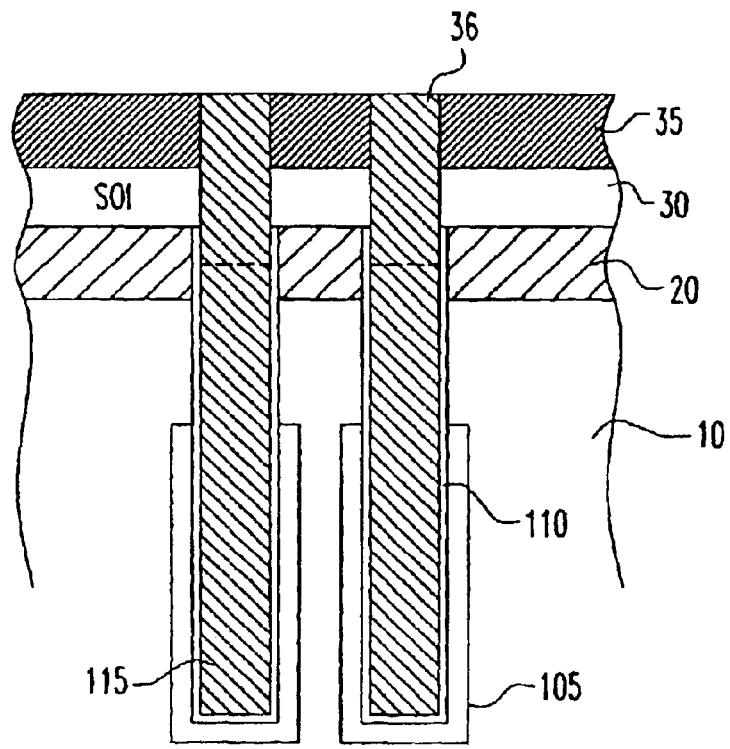
FIG. 4A shows the area of FIG. 2 after filling the recessed area in the capacitor.

FIG. 4A shows the same region as FIG. 2 after a step of filling recess 118 in FIG. 2 with doped poly. A dotted line denotes the separation between the portion of poly added after FIG. 2.

Figure 4B:
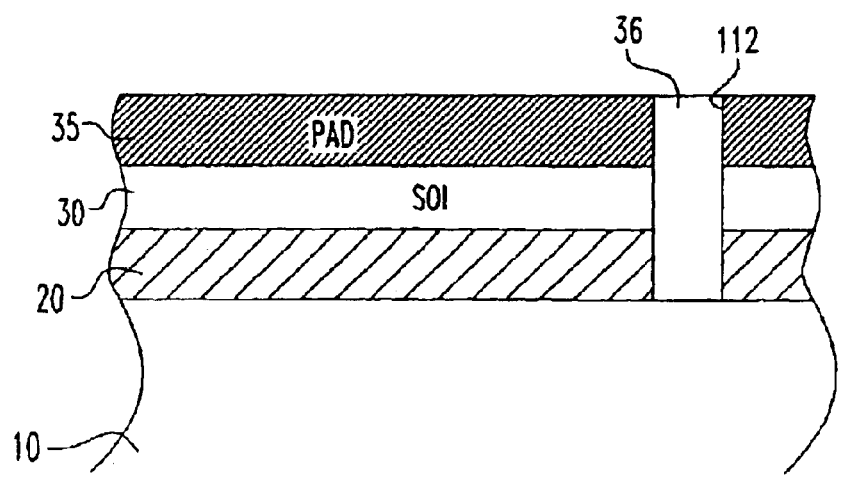
FIG. 4B shows the area of FIG. 3 after filling the via.

FIG. 4B shows via 155 of FIG. 3 after filling it simultaneously with the recess in the DRAM array. The conductive filling (also referred to as a plug) is denoted with numeral 36. Heavy line 112 represents an optional dielectric liner (e.g. nitride) that isolates the plug 36 from the SOI layer 30.

Figure 5:
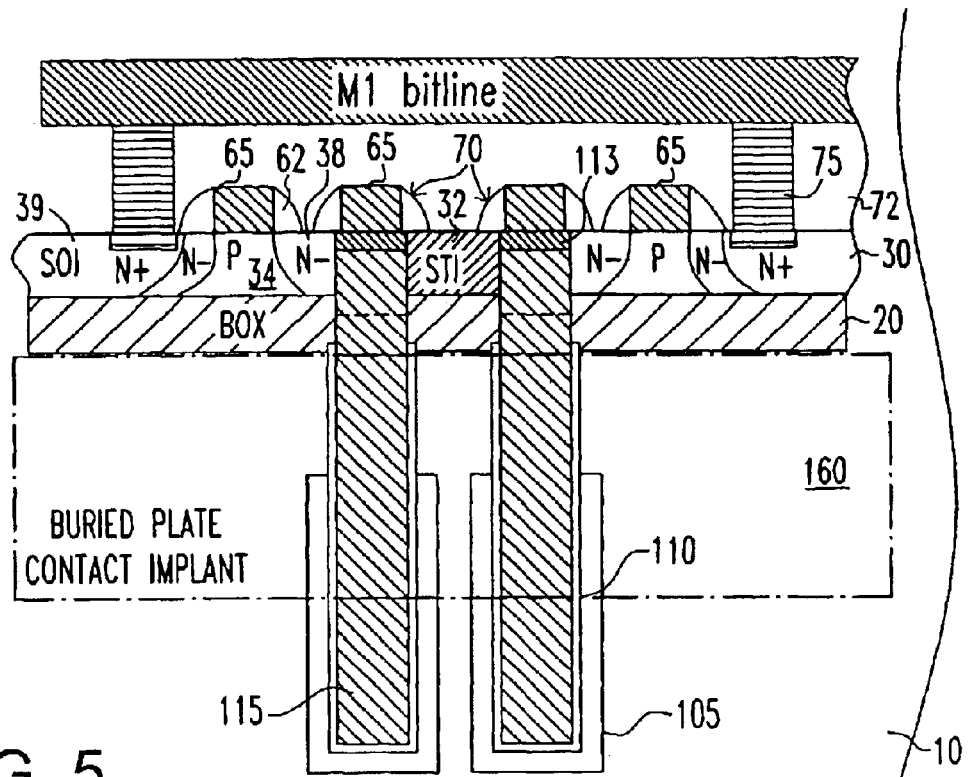
FIG. 5 shows the area of FIG. 2 after completing the cell.

FIG. 5 shows a completed portion of the DRAM array of FIG. 2. An N– implant 160 (about 1E18/cm3) has been provided that extends down nominally 1 um from the lower surface of the BOX to overlap and make contact with the buried plates. This implanted area forms a conductive path to maintain the buried plates at their specified voltage of ground.

The device layer has NFET pass transistors 60 formed in it. The body of the pass transistors is P-doped by implantation at any convenient time. Gates 65 have been formed over a conventional gate oxide and sidewalls 62 have been formed. An N+ Source/Drain (S/D) implant has been made in areas 39, with the sidewalls 62 reducing the implanted dose to N– in the areas 38 adjacent to the transistor bodies.

Passing wordlines 70 are shown as crossing the tops of the capacitors, separated vertically from the center electrodes of the capacitors 115 by trench top oxide (or other dielectric) 113. The capacitors are separated by oxide-filled isolation trenches (STI) 32, formed at the same time as the STI in the logic areas. Top dielectric 113 is made sufficiently thick to prevent cross talk from the passing wordlines. If the architecture of the DRAM array is not one that uses passing wordlines (referred to as a folded bitline architecture), or if the passing wordlines do not cause crosstalk, the separate dielectric may be dispensed with or the gate oxide may be the only dielectric.

Figure 6:
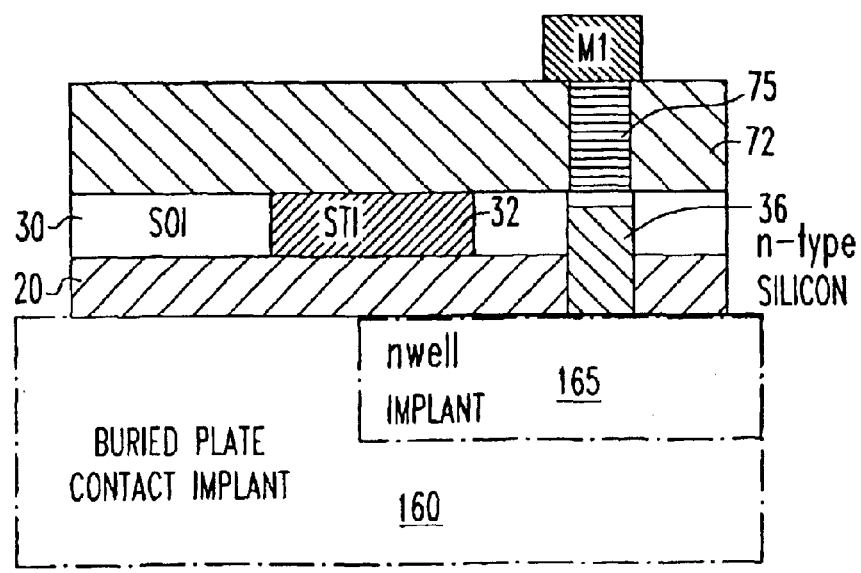
FIG. 6 shows the area of FIG. 3 after completing the implants for connecting to the buried plates.
Figure 7A:
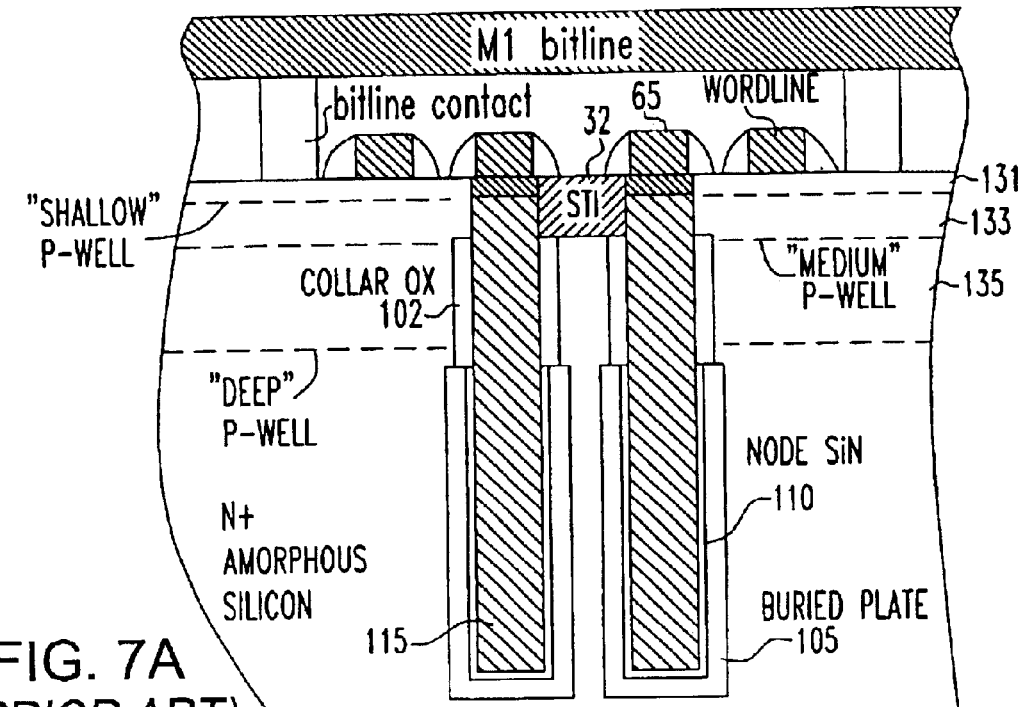
FIG. 7A shows a cross section of a wafer according to the prior art.
Figure 7B:
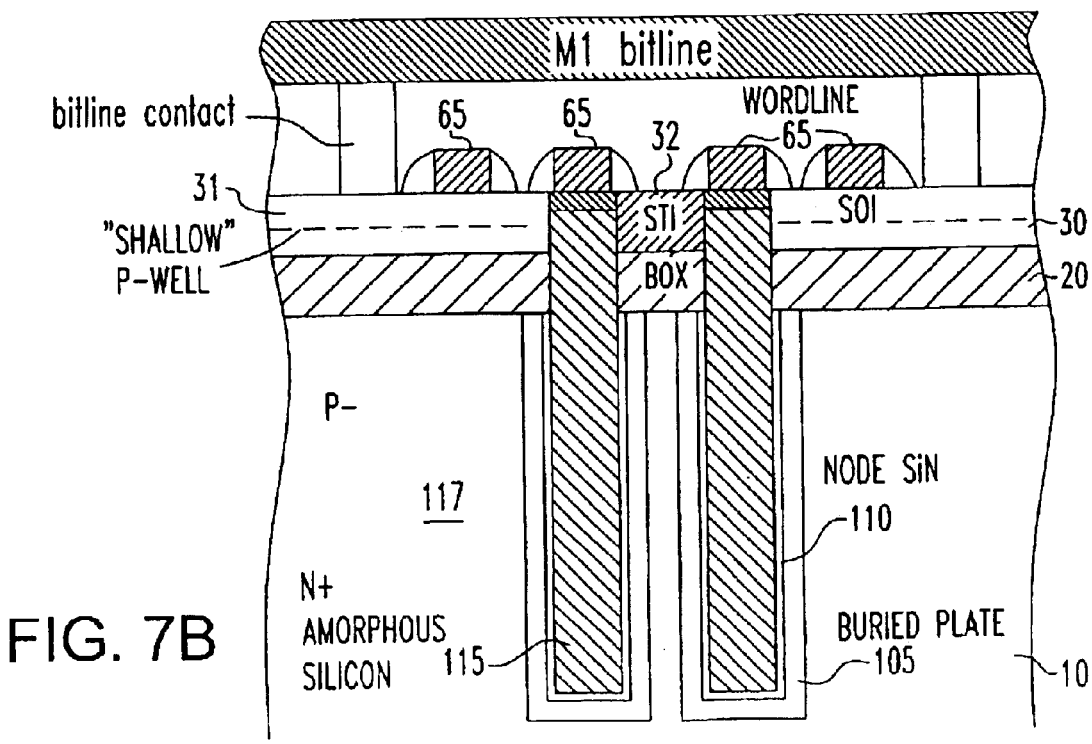
FIG. 7B shows a corresponding cross section of a wafer according to the invention.

FIG. 6 shows the area of FIG. 3 after the back end processing up to metal 1. Plug 36 of FIG. 4B has been topped with a Tungsten via 75 placed in an interlevel dielectric 72. Via 75 makes contact with a portion of the M1 interconnect that links it to the correct reference voltage.

An N-well implant 165 has been made to establish ohmic contact between the plug 75 and the buried plate contact implant 160.

The plugs will be placed as required to establish the designed impedance to the buried plates. Preferably, the plugs will not be placed in the array, as that would interfere with the most compact layout. Advantageously, the plugs are placed in the Nband diffusion guard ring or another location on the periphery of the array, but not within it.

Transistor formation is preferably the same as that for NFETs in the logic area. The cell transistors have floating bodies, while the logic transistors may have body contacts. Those skilled in the art would expect that there would be the usual, well known problems associated with the generation of holes in the floating bodies of the array NFETs.

It has been found that an operation sequence in which the bitline is returned to ground after writing to the capacitor and is maintained at ground during most of the time, provides an impedance path to ground through the transistor electrode and bitline that is sufficient to drain off holes generated during operation, and therefore avoids the need to add a body contact to the area of the DRAM cell.

This invention requires an additional mask for vias 155 of FIG. 3 and an additional Reactive Ion Etch (RIE) step. The Well implant 165 to make contact with the plugs can be performed simultaneously with the logic n-well process. However, as well isolation implants are typically avoided in SOI processing, a separate mask may be required such that one is allowed to implant an n-type dopant beneath the BOX, e.g. in the Nband diffusion guard ring surrounding the eDRAM arrays.

A number of processing steps within the trench capacitor module is eliminated in this invention. Specifically, the simplified trench process allows the elimination of — (1) the collar oxide conventionally used for bulk eDRAM, (2) a trench polyfill deposition, (3) a polysilicon chemical-mechanical polish (CMP), (4) a polysilicon recess. It is conservatively estimated that 90 hours of process time can be saved by creating eDRAM in unpatterned SOI substrates — using the invention described therein—vs. creating eDRAM in patterned SOI substrates.

As a design alternative, the buried plate could be formed with a top closer to the bottom of the BOX and therefore require a buried plate contact implant 160 having less thickness. For a given concentration, a thicker implant takes more time than a more shallow one, so a thinner implant will save additional time. In addition, the thicker implant will do more damage to the crystal structure of the device layer and to the gate oxide.

The Process Sequence is:
Provide a p-type SOI substrate with a BOX uniformly across the wafer
Deep Trench Module
   Etch Deep Trench (DT) through Device Layer and through BOX
   Form Buried Plates
   Form DT Capacitor Dielectric up to wafer surface
   Deposit doped center electrode
   Recess center electrode halfway into BOX, leaving the level of the capacitor
Dielectric in the middle of the BOX
   Etch contact vias through nitride, silicon device layer and BOX
   Prepare sidewalls of DT capacitor for strap
   Fill both the recessed deep trench and the contact vias with doped poly
   Planarize the wafer
   Optionally
      Recess the Deep trench for the TTO (10-20 nm)
      Deposit TTO (HDP oxide?)
      Planarize the wafer
STI Module to isolate eDRAM cells in arrays and provide isolation for support logic circuits
Implant Module
   Implant the DRAM array with a buried plate contact implant (N−) that extends down to make contact with the buried plates and is doped heavily enough to provide a current path to a reference voltage (ground).
   Implant N-wells as needed for sufficient contact with the array buried plates—preferably within the Nband diffusion ring surrounding the array blocks.
Transistor Module
   N-Well implant in the device layer of the logic area and P-well implant in both the logic area and array in the device layer
      STI in array and support
      Gate Oxide
      Poly gates
      Sidewalls
      S/D implant
Interconnect Module
   Conventional Back End The steps of forming the logic transistors and the interconnects (collectively the "back end") will be referred to as completing the circuit.

In order to provide a relatively low impedance path to the buried plates, it may be desirable to etch a relatively long (compared with the dimensions of the contacts) trench in the periphery of the DRAM array.

It is preferred that vias for buried plate contacts not be formed within the array, but a relatively low doping concentration imposed for other engineering reasons may require it.

The invention has been reduced to practice with contacts only on the periphery.

While the invention has been described in terms of a single preferred embodiment, those skilled in the art will recognize that the invention can be practiced in various versions within the spirit and scope of the following claims.

What is claimed is:

1. A method of making an integrated circuit containing a DRAM array having DRAM cells with deep trench capacitors in an SOI wafer comprising the steps of:
providing an SOI substrate having a uniform BOX and an SOI layer above the BOX;
etching deep trenches in the DRAM array through the BOX;
forming buried plates surrounding the deep trenches;
forming a dielectric on the inner surfaces of the deep trench up to at least the bottom of the BOX;
depositing a conductive material as the center electrode in the capacitor;
recessing the center electrode of the capacitor below the top surface of the BOX, thereby forming a capacitor aperture;
etching contact vias down to a contact level below the bottom of the BOX;
filling the capacitor aperture and the contact vias simultaneously with conductive material, thereby forming conductive plate bias plugs in the contact vias;
implanting a buried plate contact layer in the substrate in the array, extending vertically to overlap the buried plates;
making contact with the plate bias plugs and with the buried plate contact layer, thereby establishing a conductive path between the buried plates and the plate bias contacts;
forming FETs with floating bodies in the SOI layer, connecting a cell contact with the center electrode; and
completing the circuit.

2. A method according to claim 1, further comprising a step of preparing the sidewalls of the capacitor aperture for the formation of a conductive path into the pass transistor.

3. A method according to claim 2, in which said contact vias are formed in a doped area outside the DRAM array.

4. A method according to claim 3, in which said contact vias are formed by etching trenches in a doped area outside the DRAM array.

5. A method according to claim 2, in which said buried plate contact layer extends downwardly from the bottom of the BOX to make contact with the buried plates in a buried plate overlap region.

6. A method according to claim 5, in which the buried plates extend upwardly to the bottom of the BOX and in which said buried plate contact layer extends downwardly from the bottom of the BOX to make contact with the buried plates in a buried plate overlap region that is co-extensive with the buried plate contact layer.

7. A method according to claim 6, in which the buried plate contact layer has a dopant concentration of -, thereby establishing conductive contact with the plugs.

8. A method according to claim 1, in which said contact vias are formed in a doped area outside the DRAM array.

9. A method according to claim 8, in which said contact vias are formed by etching trenches in a doped area outside the DRAM array.

10. A method according to claim 1, in which said buried plate contact layer extends downwardly from the bottom of the box to make contact with the buried plates in a buried plate overlap region.

11. A method according to claim 10, in which the buried plates extend upwardly to the bottom of the BOX and in which said buried plate contact layer extends downwardly from the bottom of the BOX to make contact with the buried plates in a buried plate overlap region that is co-extensive with the buried plate contact layer.

12. A method according to claim 11, in which the buried plate contact layer has a dopant concentration of, thereby establishing conductive contact with the plugs.

13. A method according to claim 11, in which the step of making contact with the plate bias plugs and with the buried plate contact layer is effected by implanting an n-well contacting the plate bias plugs and the buried plate contact layer.

14. A method according to claim 13, in which said contact vias are formed by etching trenches in a doped area outside the DRAM array.

15. A method according to claim 1, in which in which the step of making contact with the plate bias plugs and with the buried plate contact layer is effected by implanting an n-well contacting the plate bias plugs and the buried plate contact layer.

16. A method according to claim 15, in which said contact vias are formed by etching trenches in a doped area outside the DRAM array.

17. An integrated circuit containing a DRAM array having DRAM cells with deep trench capacitors in an SOI wafer, comprising:

an SOI substrate having a uniform BOX layer;

a set of cells in the DRAM array having deep trench capacitors that extend through the BOX;

a set of buried plates formed around at least the bottom of the deep trenches;

a capacitor dielectric formed on the inner surfaces of the deep trench and extending up to at least the bottom of the BOX;

a center electrode in the capacitor formed from a conductive material;

a set of cell pass transistor FETs with floating bodies formed in a device SOI layer and connecting a cell contact with the center electrode;

a buried plate contact layer formed in the substrate in the array, extending vertically to overlap the buried plates in a buried plate overlap region; and a set of conductive plate bias plugs extending vertically through the device SOI layer and through the BOX and making contact with the buried plate contact layer, thereby establishing a conductive path between the buried plates and the plate bias contacts.

18. An integrated circuit according to claim 17, in which: the buried plates are separated vertically from the BOX by a buried plate offset region, so that the capacitor dielectric is adjacent to the buried plate contact layer in the buried plate offset region.

19. An integrated circuit according to claim 18, in which the plate bias plugs are formed in a doped area outside the DRAM array.

20. An integrated circuit according to claim 18, in which the plate bias plugs are formed by etching trenches in a doped area outside the DRAM array.

21. An integrated circuit according to claim 17, in which: the buried plates extend upward vertically to at least the bottom surface of the BOX, so that the buried plate overlap region is co-extensive with the buried plate contact layer, so that the capacitor dielectric is separated from the buried plate contact layer by the buried plate at all vertical positions.

22. An integrated circuit according to claim 21, in which the plate bias plugs are formed in a doped area outside the DRAM array.

23. An integrated circuit according to claim 21, in which the plate bias plugs are formed by etching trenches in a doped area outside the DRAM array.

24. An integrated circuit according to claim 17, in which the plate bias plugs are formed in a doped area outside the DRAM array.

25. An integrated circuit according to claim 17, in which the plate bias plugs are formed by etching trenches in a doped area outside the DRAM array.

* * * * *